United States Patent [19]

Sugiyama et al.

[11] Patent Number: 5,264,319

[45] Date of Patent: Nov. 23, 1993

[54] PHOTOSENSITIVE RESIN COMPOSITION HAVING HIGH RESISTANCE TO OXYGEN PLASMA, CONTAINING ALKALI-SOLUBLE ORGANOSILICON POLYMER AND PHOTOSENSITIVE DISSOLUTION INHIBITOR

[75] Inventors: Hisashi Sugiyama, Yokohama; Kazuo Nate, Machida; Takashi Inoue; Akiko Mizushima, both of Yokohama, all of Japan

[73] Assignee: Hitachi, Ltd.

[21] Appl. No.: 893,946

[22] Filed: Jun. 4, 1992

Related U.S. Application Data

[63] Continuation of Ser. No. 370,283, Jun. 23, 1989, abandoned, which is a continuation of Ser. No. 1,229, Jan. 5, 1987, abandoned, which is a continuation-in-part of Ser. No. 859,370, May 5, 1986, Pat. No. 4,745,169.

[30] Foreign Application Priority Data

| | | |
|---|---|---|
| May 10, 1985 [JP] | Japan | 60-98032 |
| Aug. 22, 1985 [JP] | Japan | 60-182950 |
| Oct. 24, 1985 [JP] | Japan | 60-236344 |
| Jan. 8, 1986 [JP] | Japan | 61-510 |

[51] Int. Cl.$^5$ .............................................. G03F 7/023
[52] U.S. Cl. ........................................ 430/192; 430/191; 430/193; 430/270; 430/312
[58] Field of Search .............. 430/190, 192, 193, 270, 430/312, 191

[56] References Cited

U.S. PATENT DOCUMENTS

| | | | |
|---|---|---|---|
| 3,410,820 | 11/1968 | Harrod | 260/37 |
| 3,647,443 | 3/1972 | Rauner et al. | 430/190 |
| 3,953,212 | 4/1976 | Miyano et al. | 430/192 |
| 4,510,227 | 4/1985 | Mohr et al. | 430/192 |
| 4,517,276 | 5/1985 | Lewis | 430/192 |
| 4,564,575 | 1/1986 | Perreault et al. | 430/192 |
| 4,587,196 | 5/1986 | Toukhy | 430/192 |
| 4,603,195 | 7/1986 | Babich et al. | 430/193 |
| 4,613,398 | 9/1986 | Chiong et al. | 430/313 |
| 4,624,909 | 11/1986 | Saotome et al. | 430/192 |
| 4,722,881 | 2/1988 | Ueno et al. | 430/270 |
| 4,745,169 | 5/1988 | Sugiyama et al. | 430/192 |
| 4,822,716 | 4/1989 | Onishi et al. | 430/192 |

FOREIGN PATENT DOCUMENTS

| | | | |
|---|---|---|---|
| 2130283 | 12/1971 | Fed. Rep. of Germany | 430/192 |
| 59-2041 | 1/1984 | Japan | 430/192 |

OTHER PUBLICATIONS

Reichmanis, E. et al., *Solid State Technology*, Aug. 1985, pp. 130–135.

*Primary Examiner*—Richard L. Schilling
*Assistant Examiner*—Christopher G. Young
*Attorney, Agent, or Firm*—Antonelli, Terry Stout & Kraus

[57] ABSTRACT

Disclosed herein is a photosensitive resin composition composed mainly of an alkali-soluble organometallic polymer and a photosensitive dissolution inhibitor. The composition is used as a positive type resist which can be developed with an alkali developing solution. The resist has high sensitivity, high resolution, and resistance to oxygen plasma.

12 Claims, No Drawings

PHOTOSENSITIVE RESIN COMPOSITION HAVING HIGH RESISTANCE TO OXYGEN PLASMA, CONTAINING ALKALI-SOLUBLE ORGANOSILICON POLYMER AND PHOTOSENSITIVE DISSOLUTION INHIBITOR

This application is a Continuation of application Ser. No. 07/370,283, filed Jun. 23, 1989 now abandoned, which is a continuation of Ser. No. 07/001,229, filed Jan. 5, 1987 now abandoned, which is a continuation-in-part of Ser. No. 06/859,370, filed May 5, 1986, now U.S. Pat. No. 4,745,169.

BACKGROUND OF THE INVENTION

The present invention relates to a photosensitive resin composition, and more particularly, it relates to a photosensitive resin composition suitable for use as the top layer resist used in the two-layer resist process which requires a good resistance to oxygen plasma. The composition of the present invention will be used to form fine patterns necessary for the production of semiconductor elements.

The production of electronics components such as semiconductor elements, magnetic bubble memory, and integrated circuits involves the process of pattern formation. Heretofore, the pattern formation has been generally accomplished by using a photoresist which is sensitive to ultraviolet light or visible light. There are two types of photoresists: A negative type characterized by that the exposed part becomes insoluble in the developing solution; and a positive type characterized by that the exposed part becomes soluble in the developing solution. The negative type is superior to the positive type in sensitivity, adhesion to the substrate necessary for wet etching, and chemical resistance. For this reason, the photoresist of negative type has been predominant. However, with the advent of semiconductor elements having a high degree of integration and a pattern composed of extremely fine lines arranged close to each other, and also with the acceptance of dry etching for the patterns, there has arisen a demand for a photoresist having a high resolution and high resistance to dry etching. Nowadays, therefore, the photoresist of positive type has become to account for a large share. The most widely used photoresist of positive type is that of alkali development type which is based on an alkali-soluble novolak resin. It is outstanding in sensitivity, resolution, and dry etching resistance among many photoresists of positive type. It is explained in Kodak Microelectronics Seminor Proceedings, p. 116, (1976), by J. C. Strieter.

The photoresist of positive type, however, does not meet the recent requirements for higher density and higher integration and multilayer wiring structure of semiconductor elements, so long as the conventional monolayer resist method is employed. In such semiconductor elements there are irregularities on the substrate surface on which the pattern is to be made. Forming an accurate pattern of submicron level on such a substrate surface is very difficult on account of the variation of development condition resulting from the difference of resist film thickness, and the irregular reflection and standing wave of the exposing light that occur at the stepped part on the surface. In order to overcome the difficulty encountered in forming a submicron pattern on the stepped substrate, there has been proposed the multi-layer resist method. This method includes the three-layer resist method and the two-layer resist method In the case of three-layer resist method, the stepped substrate is coated with an organic flattening film, and then an inorganic intermediate layer and resist are placed on top of the other. A desired pattern is formed on the resist. Using the resist as a mask, the intermediate layer is subjected to dry etching. And finally, using the inorganic intermediate layer as a mask, a pattern is formed on the organic flattening film by $O_2RIE$. This method has long been studied because basically it can be carried out using the existing technology. However, it has a shortcoming of being very complex in process. Another disadvantage of this method is that cracks and pinholes are liable to occur in the intermediate layer because the organic film, inorganic film, and organic film of different properties are placed on top of the other. In contrast to the three-layer resist method, the two-layer resist method does not suffer cracks and pinholes because it employs a resist having the properties of both the resist and inorganic intermediate layer used in the three-layer resist method. In other words, this resist is resistant to oxygen plasma. The two-layer method is simpler in process than the three-layer method. Unfortunately, the conventional resist (top layer resist) used in the three-layer resist cannot be used in the two-layer resist method. Thus it is necessary to develop a new resist having resistance to oxygen plasma.

For reasons mentioned above, there has been a demand for a positive type photoresist having good resistance to oxygen plasma, high sensitivity, and high resolution which can be used for the top layer resist in the two-layer resist method and also can be developed with an alkali without the change of the existing process.

SUMMARY OF THE INVENTION

It is an object of the present invention to provide a positive type photosensitive resin composition for alkali development which has high sensitivity, high resolution, and resistance to oxygen plasma.

The object is achieved with a photosensitive resin composition composed mainly of an alkali-soluble organometallic polymer and a photosensitive dissolution inhibitor.

In the case of three-layer photoresist method, an intermediate metal oxide film is used as the oxygen plasma resistant film. Therefore, in the case of two-layer resist method, it is adequate to use an organometallic polymer for the resist; however, it is difficult to impart the photosensitivity to the organometallic polymer itself. After extensive studies it was found that if an alkali-soluble organometallic polymer is incorporated with a photosensitive dissolution inhibitor, the exposed part alone becomes selectively soluble in an alkali developing solution, whereby there is obtained a positive type resist pattern.

DESCRIPTION OF THE PREFERRED EMBODIMENTS

A description will be made of the alkali-soluble organometallic polymer which is one of the major constituents of the photosensitive resin composition of the invention. The metallic element in the alkali-soluble organometallic polymer is required to be efficiently converted into a metal oxide film. Therefore, the metallic element in the alkali-soluble organometallic polymer should be present in the main chain rather than in the side chain. The alkali-soluble organometallic polymer should contain at least one metallic element selected from Si, Ge, Sn, and Ti which forms a stable oxide film. The one containing silicon as a major metallic element is preferable from the standpoint of economy, ease of synthesis, and safety. For the organometallic polymer to be alkali-soluble, it should have on its side chain an organic group with a hydroxyl group (preferably a phenolic hydroxyl group) or carboxylic group. For sufficient alkali-solubility, the ratio of the organic group to the side chain should preferably be high.

The alkali-soluble organometallic polymer will be described in more detail, taking the alkali-soluble organosilicon polymer as an example. The alkali-soluble organosilicon polymer includes alkali-soluble silmethylene polymers, alkali-soluble siloxane polymers, alkali-soluble polyorganosilsesquioxane polymer.

An example of the alkali-soluble silmethylene polymers is a polymer which contains more than 40% of the unit represented by the following formula (1) in the polymer skeleton.

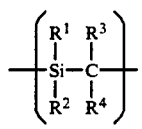

(1)

wherein $R^1$, $R^2$, $R^3$, and $R^4$ are monovalent organic groups. At least one of the four side chains should be an organic group having a phenolic hydroxyl group, and the organic group having a phenolic hydroxyl group should preferably be on a carbon atom. The monovalent organic group includes hydrogen, alkyl groups, vinyl groups, and aromatic groups, and derivatives thereof. $C_1$–$C_6$ alkyl groups are preferable for $R^1$ and $R^2$, and hydrogen is preferable for $R^3$. The organic group having a phenolic hydroxyl group includes, for example, phenols, catechols, isomers thereof, and $C_1$–$C_6$ alkyl groups having them. Phenols and catechols are preferable.

An example of the alkali-soluble siloxane polymers is a polymer which contains more than 40% of the unit represented by the following formula (2) in the polymer skeleton.

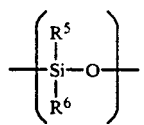

(2)

wherein $R^5$ and $R^6$ are monovalent organic groups. At least either of $R^5$ and $R^6$ should be an organic group having a phenolic hydroxyl group. The monovalent organic group includes hydrogen, alkyl groups, vinyl groups, and aromatic groups, and derivatives thereof. $C_1$–$C_6$ alkyl groups are preferable. The organic group having a phenolic hydroxyl group includes phenols, catechols, and $C_1$–$C_6$ alkyl groups having their isomers. $C_1$–$C_2$ alkyl groups having phenols or catechols are preferable.

An example of the alkali-soluble polyorganosilsesquioxane polymers is a polymer which contains more than 40% of the unit represented by the following formula (3) in the polymer skeleton.

$$(R^7\text{-SiO}_{3/2}) \qquad (3)$$

wherein $R^7$ is a monovalent organic group having phenolic hydroxyl groups, such as $C_1$–$C_6$ alkyl groups having phenols or catechols or derivatives thereof. $C_1$–$C_2$ alkyl groups having phenols or catechols are preferable.

These alkali-soluble organometallic polymers are soluble in alkaline solutions such as an aqueous solution of tetramethylammonium hydroxide and an aqueous solution of sodium hydroxide. They are also readily soluble in general-purpose solvents such as alcohols, ethers, amides, ketones, esters, and cellosolve. These alkali-soluble organometallic polymers are not corroded by oxygen plasma and are extremely resistant to dry etching.

A description will be made of the photosensitive dissolution inhibitor which is another major constituent of the composition of the invention. The photosensitive dissolution inhibitor in the photosensitive resin composition of alkali development type has the following functions. In the unexposed part, it acts as an alkali-dissolution inhibitor for the alkali-soluble organometallic polymer; and in the exposed part, it undergoes photolysis to give an alkali-soluble compound or lose the alkali-dissolution inhibiting effect, whereby rendering the exposed part alkali-soluble. The photosensitive dissolution inhibitor in the composition of the invention includes, for example, O-nitrobenzyl esters and O-quinone diazides. 1,2-naphthoquinone diazides sensitive to light of wavelength shorter than 300 nm are preferable. Their examples include the compounds (I) to (XXIV) listed in the following.

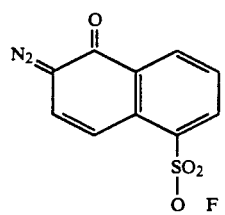

(I)

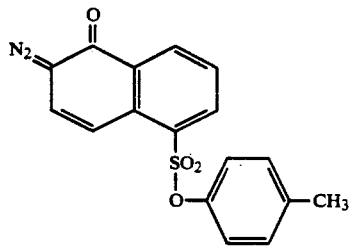
(II)
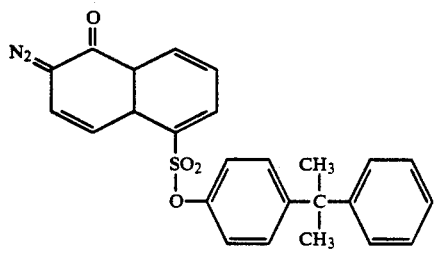
(III)
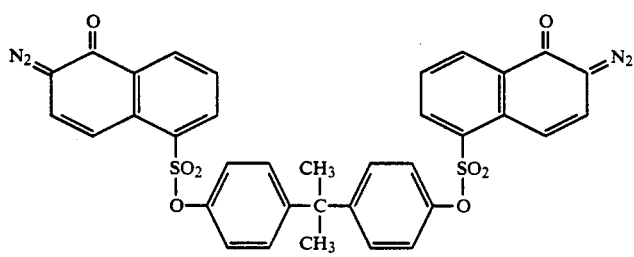
(IV)
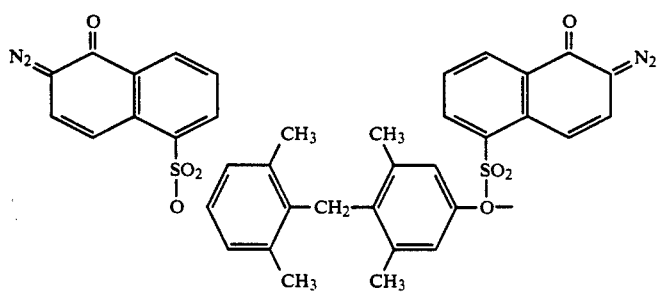
(V)
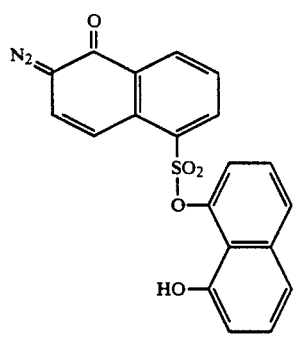
(VI)
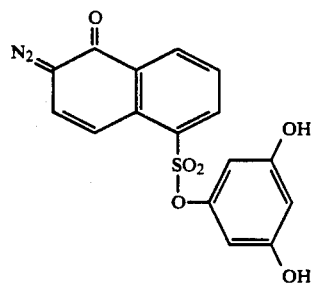
(VII)

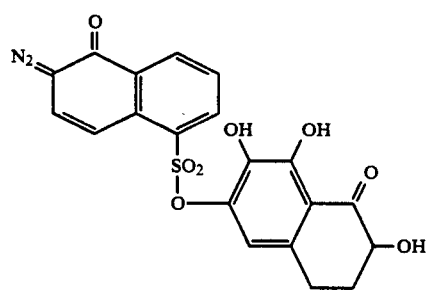
(VIII)
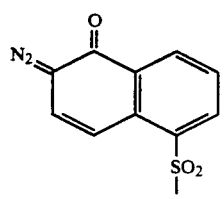
(IX)
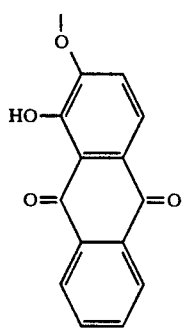
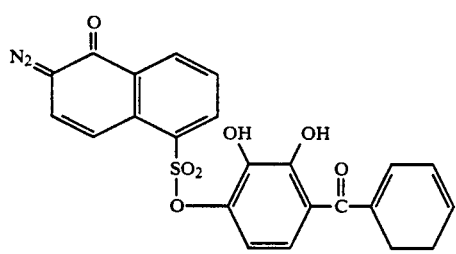
(X)
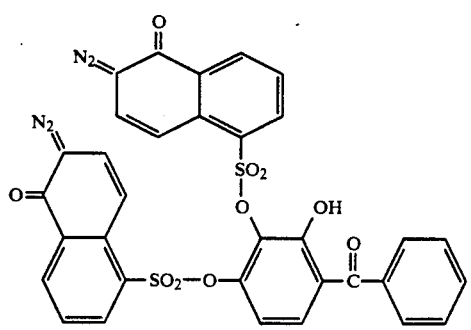
(XI)

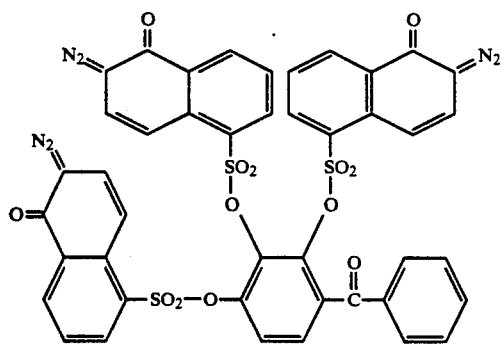
(XII)
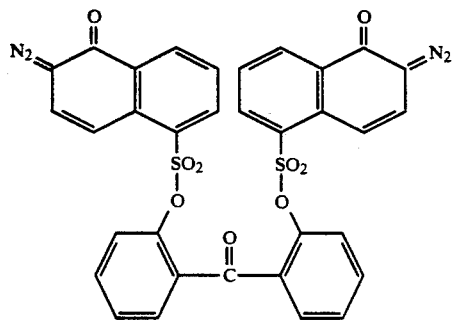
(XIII)
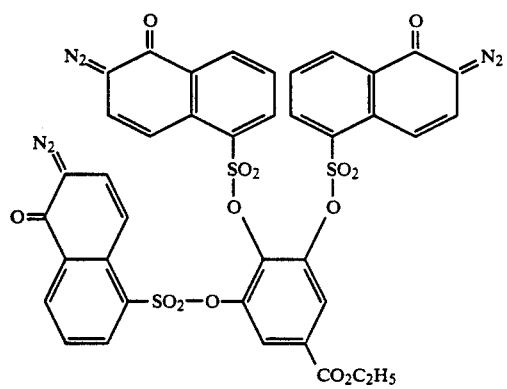
(XIV)
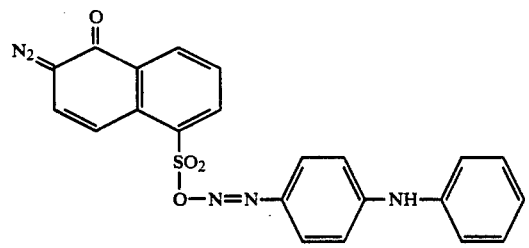
(XV)
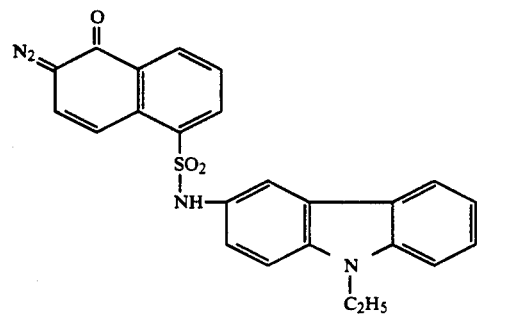
(XVI)

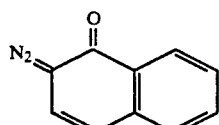 (XVII)
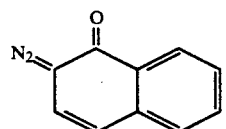
 (XVIII)
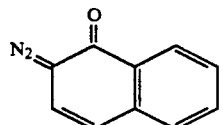 (XIX)
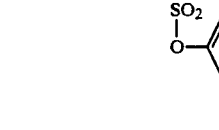 (XX)
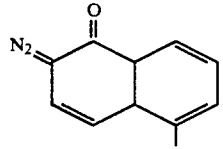 (XXI)
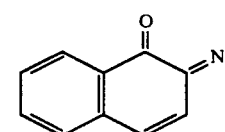
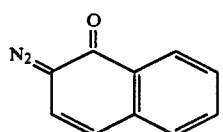 (XXII)
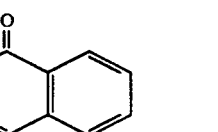

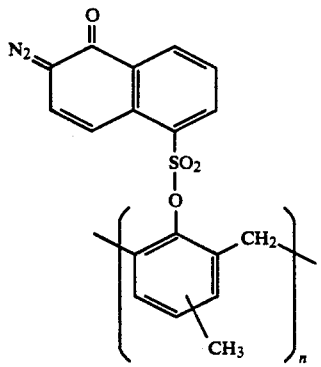

(XXIII)

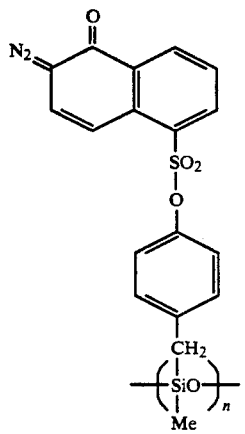

(XXIV)

A description will be made of the usage of the composition of the invention for forming a pattern on a semiconductor element.

First, a photosensitive resin composition is prepared from 70 to 95 wt % of polymer and 30 to 5 wt % of photosensitive dissolution inhibitor. (The polymer may contain 60 to 100 wt % of alkali-soluble organometallic polymer and 40 to 0 wt % of film former such as novolak resin. The amount of film former should not exceed 40 wt % from the standpoint of oxygen plasma resistance. The alkali-soluble organometallic polymer may be used alone or in the form of mixture. The photosensitive dissolution inhibitor may be used alone or in the form of mixture. An excess amount of photosensitive dissolution inhibitor is not preferable from the standpoint of sensitivity and oxygen plasma resistance.) The thus prepared photosensitive resin composition is dissolved in an ordinary organic solvent such as ethyl cellosolve acetate. The solution is applied by spin coating to the lower-layer resist in the two-layer resist method, followed by prebaking at a proper temperature. Thus there is obtained a film of the photosensitive resin composition of the invention. The film is irradiated with light according to a desired pattern. The irradiated part is selectively dissolved by using an alkali developing solution such as an aqueous solution of tetramethylammonium hydroxide, to give a positive resist pattern. When the lower layer resist is processed, the above-mentioned resist pattern is used as a mask and the lower layer resist is subjected to dry etching with oxygen plasma. In this way, it is possible to form a pattern having a high aspect ratio.

The photosensitive resin composition of the invention will find use not only as the top-layer resist for the two-layer resist method but also as the resist for microfabrication of organic insulations.

The photosensitive resin composition of the invention produces the following effects. The alkali-soluble organometallic polymer, which is one major constituent, forms a metal oxide film upon exposure to oxygen plasma, and the film acts as an oxygen plasma resistant film. The photosensitive dissolution inhibitor, which is another major constituent, prevents the alkali-soluble organometallic polymer at the unexposed part from dissolving in an alkali and permits the alkali-soluble organometallic polymer at the exposed part to dissolve in an alkali developing solution. Thus the combination of the two major constituents provides a positive type photoresist having a high sensitivity, high resolution, and high resistance to oxygen plasma.

The examples of the invention will be explained in the following. They should not be construed to limit the scope of the invention. The first description is concerned with the synthesis of the alkali-soluble organometallic polymer as the major constituent of the composition of the invention.

Synthesis Example 1

Synthesis of poly(1,1-dimethyl-2-p-hydroxyphenylsilmethylene) and poly(1,1-dimethyl-2-p-methoxyphenylsilmethylene-co-1,1-dimethyl-2-p-hydroxyphenylsilmethylene)

1.1 Synthesis of chlorodimethyl-p-methoxybenzylsilane

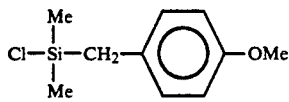

In a 2-liter three-neck flask equipped with a stirrer, reflux condenser, dropping funnel, and thermometer were placed 31.0 g (1.28 mol) of magnesium powder, 129 g (1 mol) of dimethyldichlorosilane, and 500 ml of diethyl ether. With the flask cooled below 10° C., a mixture of 100 g (0.639 mol) of p-methoxybenzyl chloride and 250 ml of diethyl ether was added dropwise over 4 hours from the dropping funnel. After aging at room temperature for 1 hour, excess magnesium and magnesium chloride were removed by filtration under reduced pressure. The filtrate was distilled to give 87.8 g (0.409 mol) of the desired product.

Yield: 64.0%, boiling point: 80° C./1 mmHg.

NMR spectrum (60 MHz, CCl$_4$, CH$_2$Cl$_2$ δ5.33): δ0.46 (6 H, s), 2.40 (2 H, s), 3.83 (3 H, s), 6.82 (2 H, d, J=9.0 Hz), 7.08

(2 H, d, J=9.0 Hz).

IR spectrum ($v$cm$^{-1}$): 2970, 1620, 1520, 1475, 1310, 1260, 1195, 1090, 1055, 855, 825, 780.

1.2 Synthesis of bromo-p-methoxyphenylchlorodimethylsilylmethane (dl):

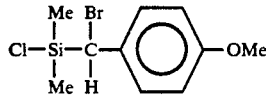

In a 500-ml three-neck flask equipped with a stirrer and reflux condenser were placed 43.2 g (0.200 mol) of chlorodimethyl-p-methoxybenzylsilane and 200 ml of carbon tetrachloride. With stirring, 35.6 g (0.200 mol) of N-bromosuccinimide was added slowly. After aging for 1 hour, succinimide was removed by filtration under reduced pressure. The filtrate was distilled to give 31.7 g (0.108 mol) of the desired product. Yield: 54.0%, boiling point: 113°-117° C./2.5 mmHg, melting point: lower than 30° C. NMR spectrum (60 MHz, CCl$_4$, TMS): δ0.50 (3 H, s), 0.60 (3 H, s), 3.73 (3 H, s), 4.32 (1 H, s), 6.73 (2 H, d, J=9 Hz), 7.19 (2 H, d, J=9 Hz). IR spectrum ($v$cm$^{-1}$): 1610, 1510, 1466, 1305, 1260, 1185, 1040, 865, 845, 820, 800.

1.3 Synthesis of poly(1,1-dimethyl-2-p-methoxyphenylsilmethylene)

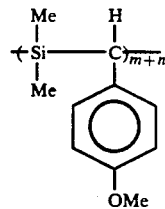

In a 500-ml three-neck flask equipped with a Herschberg stirrer, reflux condenser, and dropping funnel, with the atmosphere therein replaced with nitrogen, were placed 7.6 g (0.33 g atom) and 120 ml of toluene. Upon heating and stirring, there were obtained fine sodium particles. With stirring and refluxing, a mixture of 44.1 g (0.15 mol) of bromo-p-methoxyphenyl-chlorodimethylsilylmethane and 30 ml of toluene was added dropwise over 1 hour. After aging for 1 hour, the reaction mixture was poured into methanol to remove excess sodium and to cause the polymer to separate. After filtration, the polymer dissolved in tetrahydrofuran was poured into water to remove the sodium salt. The filtered polymer was washed with methanol, followed by drying under reduced pressure. Thus there was obtained 10 g of the desired product. Yield: 37%, softening point: 121°-125° C., average molecular weight: 3,400. NMR spectrum (60 MHz, C$_6$D$_6$, CH$_2$Cl$_2$, δ5.33): δ1.27 (6 H, br.s), 4.43 (3 H, br.s), 7.4–8.7 (4 H, br.s), methyl proton not detectable. IR spectrum ($v$cm$^{-1}$): 2960, 2850, 1610, 1510, 1470, 1385, 1300, 1260, 1100, 1045, 860, 790.

1.4 Synthesis of poly(1,1-dimethyl-2-p-hydroxyphenylsilmethylene) and poly(1,1-dimethyl-2-p-methoxyphenylsilmethylene-co-1,1-dimethyl-2-p-hydroxyphenylsilmethylene)

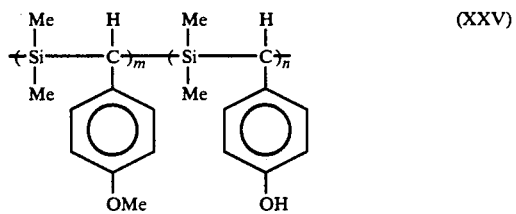

(XXV)

In a 25-ml eggplant-shape flask equipped with a reflux condenser were placed 0.50 g (2.8 mmol in terms of monomer units) of poly(1,1-dimethyl-2-p-methoxyphenylsilmethylene) having a weight-average molecular weight of 3,000, 1.5 ml of chloroform, and 0.88 g (4.4 mmol) of trimethylsilyl iodide. The reactants were stirred with a magnetic bar to carry out reaction for 4 hours. 4 ml of methanol was added, and stirring was continued for 3 hours. Low-boiling products were distilled away at room temperature under reduced pressure. The residues were extracted with ether. The ether solution was washed with an aqueous solution of sodium hydrogen sulfite, an aqueous solution of sodium hydrogen carbonate, and an aqueous solution of sodium chloride. The ether was distilled away under reduced pressure. The resulting polymer was reprecipitated from a mixture of tetrahydrofuran and water. Upon drying with heating under reduced pressure, there was obtained 0.23 g of desired product. Weight-average molecular weight: 1,800, OH content: 100%, and softening point: 107°-113° C. NMR spectrum 60 MHz, DMSO-d$_6$, δ5.68): δ0.79–0.51 (6 H, br.s), 6.15–7.35 (4 H, br.s), methyl proton and hydroxy proton not detectable. IR spectrum ($v$cm$^{-1}$): 3380, 2980, 1510, 1270, 1100, 1040, 860, 810.

The OH content can be controlled by changing the amount of trimethylsilyl iodide or the reaction time. If 1.3 equivalent of trimethylsilyl iodide for methoxy group is reacted for 4 hours, 90% of the methoxy groups is converted into hydroxyl groups. The conversion rate was 70% at 0.80 equivalent, 55% at 0.65 equivalent, and 40% at 0.50 equivalent.

Synthesis Example 2

Synthesis of poly(methyl-p-hydroxybenzylsiloxane) and poly(methyl-p-methoxybenzylsiloxane-co-methyl-p-hydroxybenzylsiloxane)

2.1 Synthesis of methyldichloro-p-methoxybenzylsilane

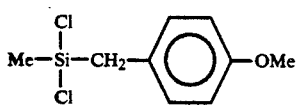

In a 1-liter three-neck flask equipped with a stirrer, reflux condenser, dropping funnel, and thermometer were placed 23.3 g (1.00 mol) of magnesium powder, 82.6 g (0.640 mol) of methyltrichlorosilane, and 200 ml of diethyl ether. Magnesium was activated with iodine and dibromoethane. The flask was cooled to 10° C. to 0° C. A mixture of 50.0 g (0.319 mol) of p-methoxybenzyl chloride and 300 ml of diethyl ether was added dropwise over 4 hours from the dropping funnel. After aging at room temperature for 1 hour, excess magnesium and magnesium chloride were removed by filtration under reduced pressure. The filtrate was distilled to give 48.8 g (0.208 mol) of the desired product. Yield: 65% The physical properties of the desired product were as follow:

Boiling point: 80°-88° C./2 mmHg.
NMR spectrum (60 MHz, CCl₄, CH₂Cl₂ δ5.33): δ0.79 (3 H, s),
δ2.68 (2 H, s), 3.84 (3 H, s , δ6.80 2 H, d, J=9 Hz), δ7.18
(2 H, d, J=9 Hz).
IR spectrum ($\nu$cm$^{-1}$)): 1620, 1520, 1480, 1310, 1260, 1190,
1100, 1050, 850, 810, 755.

2.2 Synthesis of methyl-p-methoxybenzylsiloxane trimer

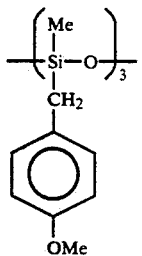

In a 1-liter three-neck flask equipped with a stirrer, reflux condenser, and dropping funnel was placed 200 ml of water. With stirring, a mixture of 85.6 g (0.364 mol) of methyldichloro-p-methoxybenzylsilane and 200 ml of ethyl ether was added dropwise over 4 hour at room temperature. After aging for 1 hour, the organic materials were extracted with diethyl ether. The extract was washed with water until the washings were neutral. The diethyl ether solution was dried with sodium sulfate. Diethyl ether was distilled away, and distillation was continued together with calcium hydride. Thus there was obtained 20.3 g (37.5 mmol) of the desired product. Yield: 31%

The physical properties of the desired product were as follow:

Boiling point: 241° C./0.8 mmHg to 253° C./0.13 mmHg.
NMR spectrum (60 MHz, CCl₄, CH₂Cl₂ δ5.33): δ- 0.02, δ0.03,
δ0.16 (9 H, sx3), δ1.96, δ2.07 (6 H, sx2), δ3.79 (9 H, s),
δ6.74 (CH, d, J=9 Hz), δ6.98 (6 H, d, J=9 Hz).

IR spectrum ($\nu$cm$^{-1}$): 1620, 1520, 1470, 1305, 1260, 1220,
1185, 1090, 1030, 840, 815, 770.

2.3 Synthesis of poly(methyl-p-methoxybenzylsiloxane)

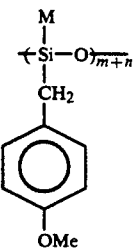

In a 100-ml eggplant-shape flask containing a magnet rod were placed 9.0 g (17 mmol) of methyl-p-methoxybenzylsiloxane trimer and 45 mg (0.5 wt %) of tetramethylammonium hydroxide. With the mouth stoppered, the flask was dipped in an oil bath at 80° C., and the reactants were stirred by the magnet rod. Four minutes after the start of reaction, the weight-average molecular weight reached 5,000. It reached 10,000 after 10 minutes, 14,000 after 20 minutes, 16,000 after 30 minutes, and 19,000 after 60 minutes. After reaction for an adequate period of time, the flask was removed from the oil bath and cooled with water, to give a product having a desired weight-average molecular weight. The content in the flask was used as such for the subsequent reaction.

The physical properties of the desired product were as follow:

NMR spectrum 60 MHz, CCl₄, CH₂Cl₂ δ5.33): δ0.00 (3 H,
br.s., δ1.94 (2 H, br.s), δ3.71, δ3.80 (3 H, sx2 ), δ6.82 (4 H,
br.s).

IR spectrum ($\nu$cm$^{-1}$): 2975, 2850, 1620, 1520, 1475, 1305,
1260, 1225, 1190, 1090, 1040, 845, 810, 775, 755

2.4 Synthesis of poly(methyl-p-hydroxybenzylsiloxane) and poly(methyl-p-methoxybenzylsiloxane-co-methyl-p-hdyroxy-benzylsiloxane)

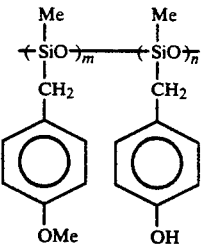

(XXVI)

In a flask equipped with a reflux condenser was placed poly(methyl-p-methoxybenzylsiloxane), and the atmosphere in the flask was replaced with nitrogen. 30 ml of chloroform was added to the flask to make a uniform solution of the polymer. A predetermined amount of trimethylsilyl iodide was added. The reactants were stirred at room temperature for 3 hours. 20 ml of methanol was added, and stirring was continued for 2 hours. After the reaction was completed, the low-boiling fractions were distilled away under reduced pressure at room temperature. The residues were extracted with tetrahydrofuran and diethyl ether. The extract was washed with an aqueous solution of sodium hydrogen sulfite, an aqueous solution of sodium hydrogen carbonate, and an aqueous solution of sodium chloride. The solvent was distilled away under reduced pressure. Thus there was obtained the desired product. The methoxy groups were 100% converted into hydroxyl groups by reacting 1.5 equivalent of trimethylsilyl iodide for the methoxy groups. The conversion rate was 90% at 1.3 equivalent, 71% at 0.76 equivalent, 58% at 0.65 equivalent, and 41% at 0.47 equivalent.

The physical properties of the desired product were as follow:

Melting point: 53°–68° C. (weight-average molecular weight:

10,000, 80% OH polymer)

NMR spectrum (60 MHz, CD$_3$CSCD$_3$, CH$_2$Cl$_2$ δ5.68): δ-0.07

(br.s, CH$_3$), δ1.85 (br.s, —CH$_2$—), δ4.00 (br.s, —OCH$_3$), δ6.61

(br.s, ring proton), δ8.81 (br.s, —OH)

IR spectrum (νcm$^{-1}$): 3320, 1620, 1510, 1450, 1270, 1240, 1180, 1070, 840, 800

Synthesis Example 3

Synthesis of poly(p-hydroxybenzylsilsesquioxane) and poly(p-methoxybenzylsilsesquioxane-co-p-hydroxybenzylsilsesquioxane)

3.1 Synthesis of p-methoxybenzyltrichlorosilane

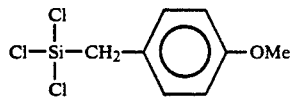

In a 2-liter three-neck flask equipped with a stirrer, reflux condenser, dropping funnel, and thermometer were placed 30 g (1.2 g atom) of magnesium powder, 170 g (1.00 mol) of silicon tetrachloride, and 500 ml of diethyl ether. With the flask cooled below 10° C., a mixture of 100 g (0.639 mol) of p-methoxybenzyl chloride and 200 ml of diethyl ether was added dropwise over 4 hours from the dropping funnel. After aging at room temperature for 1 hour, excess magnesium and magnesium chloride were removed by filtration under reduced pressure. The filtrate was distilled to give 44.0 g (0.172 mol) of the desired product. Yield: 62.9%, boiling point: 117.5°–119.5° C./3.0 mmHg NMR spectrum (60 MHz, CCl$_4$, CH$_2$Cl$_2$ δ5.33): δ2.91 (2 H, s), 3.90 (3 H,s), 6.91 (2 H, d, J=8 Hz), 7.20 (2 H, d, J=8 Hz).

3.2 Synthesis of poly(p-methoxybenzylsilsesquioxane)

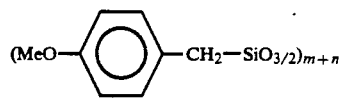

In a 100-ml three-neck flask equipped with a magnet rod, reflux condenser, and dropping funnel were placed 10 g (0.13 mmol) of sodium hydrogen carbonate and 40 ml of water. A mixture of 10.23 g (40.0 mmol) of p-methoxybenzyltrichlorosilane and 10 ml of diethyl ether was added dropwise over 30 minutes from the dropping funnel, followed by aging for 30 minutes. After the reaction was completed, the reaction mixture was extracted with ether, and the extract was dried with sodium sulfate. Diethyl ether was distilled away under reduced pressure. Thus there was obtained 5.10 g of hydrolyzate.

NMR spectrum (60 MHz, CDCl$_3$, CH$_2$Cl$_2$ δ5.33) δ2.03 (2 H, br.s), 3.80 (3 H, br.s), 6.80 (4 H, br.s)

IR spectrum (νcm$^{-1}$): 3400, 2950, 2850, 1610, 1510, 1460, 1300, 1250, 1180, 1090, 1035, 890, 835, 790, 760

Weight-average molecular weight: 2,000

In a 25-ml flask were placed 4.80 g of the above-mentioned hydrolyzate and 49 mg of 10 wt % methanol solution of potassium hydroxide. The reactants were heated at 200° C. for 2 hours. After the reaction was completed, the reaction mixture was dissolved in benzene, and the solution was added dropwise to methanol to cause solids to separate. After filtration and drying under reduced pressure, there was obtained 4.00 g of the desired product.

NMR spectrum (60 MHz, CDCl$_3$, CH$_2$Cl$_2$ δ5.33):
δ1.91 (2 H, br.s), 3.78 (3 H, br.s), 6.73 (4 H, br.s)

IR spectrum (νcm$^{-1}$): 2950, 2850, 1615, 1515, 1465, 1305, 1250, 1195, 1120, 1040, 840, 800, 770

Weight-average molecular weight: 3,300

3.3 Synthesis of poly(p-hydroxybenzylsilsesquioxane) and poly(p-methoxybenzylsilsesquioxane-co-p-hdyroxybenzylsilsesquioxane)

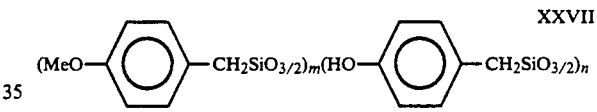

In a 100-ml eggplant-shape flask equipped with a reflux condenser were placed 3.73 g (21.6 mmol in terms of MeOC$_6$H$_4$CH$_2$SiO$_{3/2}$ unit) of poly(p-methoxybenzylsilsesquioxane), 20 ml of chloroform, and 6.92 g (34.6 mmol) of trimethylsilyl iodide. The reactants were stirred by the magnet rod at 70° C. for 72 hours. 20 ml of methanol was added at room temperature and stirring was continued for 30 minutes. Low-boiling fractions were distilled away under reduced pressure and the residues were extracted with a mixed solvent of diethyl ether and tetrahydrofuran. The extract was washed with an aqueous solution of sodium hydrogen sulfite, an aqueous solution of sodium hydrogen carbonate, and an aqueous solution of sodium chloride. The solvent was distilled away under reduced pressure. The thus obtained polymer was reprecipitated from acetone/hexane, followed by drying with heating under reduced pressure. Thus there was obtained 2.71 g of the desired product. Weight-average molecular weight: 4,000 Content of hydroxyl group: 100%

NMR spectrum (60 MHz, DMSO-d$_6$, CH$_2$Cl$_2$ δ5.68):
δ1.75 (2 H, br.s), 6.58 (4 H, br.s), 8.88 (—OH, br.s)

IR spectrum (νcm$^{-1}$): 3350, 1620, 1515, 1450, 1240, 1185, 120, 1040, 840, 805, 760

The content of hydroxyl groups can be controlled by changing the amount of trimethylsilyl iodide or the reaction time. In the case where 1.6 equivalent of trimethylsilyl iodide was used, the content was 39% with the reaction time of 4 hours, 54% with 7 hours, 75% with 12 hours, 85% with 22 hours, and 95% with 48 hours.

The content of hydroxyl groups in the polymer was determined by tracing the conversion of the methoxy group into the trimethylsiloxy group that takes place when the reaction is carried out in deutrochloroform. NMR spectrometry was employed to trace the conversion.

The above-mentioned polymers were examined for solubility in typical solvents. Those polymers containing more than 40% of hydroxyl groups are soluble in methanol, tetrahydrofuran, N,N-dimethylacetamide, 2-methylcyclohexanone, isoamyl acetate, methyl cellosolve, and dimethyl sulfoxide, but are insoluble in toluene, hexane, and carbon tetrachloride. They are soluble in aqueous solutions of tetramethyl ammonium hydroxide and sodium hydroxide.

The resistance to oxygen plasma was evaluated in the following manner. A 10 wt % solution of the polymer sample in ethyl cellosolve was applied to a silicon substrate by spin coating method. A 0.2 μm thick polymer film was formed by prebaking at 100° C. for 30 minutes. The film was exposed to oxygen plasma (oxygen pressure: 0.5 Torr, RF 300W) for 20 minutes using a barrel type etcher. The polymer film was not corroded at all. However, the film of the polymer XXV was corroded at a rate of 86 Å/min, the film of the polymer XXVI was corroded at a rate of 290 Å/min, and the film of the polymer XXVII was corroded at a rate of 23 Å/min when they were exposed to oxygen plasma using a parallel flat plate type $O_2$RIE apparatus (oxygen pressure: 20 mtorr, RF 200 W (14 MHz), cathode bias voltage −130V). Commercial products which are said to have comparatively good resistance to oxygen plasma were also evaluated under the same conditions. The film lost its thickness at a rate of about 1220 Å/min in the case of PIQ (made by Hitachi Kasei), OFPR-800 (made by Tokyo Ouka Kogyo), and AZ1350J (made by Hoechst). In the case of the above-mentioned polymer, the rate of film thinning was not affected by the content of hydroxyl groups.

The preparation and use of the composition of the invention are described with reference to the following examples, which are not intended to limit the scope of the invention.

EXAMPLE 1

A photoresist solution containing 27 wt % solids was prepared by dissolving 80 wt % of poly(p-hydroxybenzylsesquioxane) (Polymer XXVII, containing 100% hydroxyl groups) obtained in Synthesis Example 3 and 20 wt % of photosensitive dissolution inhibitor XII in ethylcellosolve acetate.

Then, the resist solution was applied to a silicon wafer by spin coating method. The coating was prebaked at 85° C. for 30 minutes to give a 1.0 μm thick resist film.

The resist film thus prepared was exposed to a different amount of light. The exposed resist film was developed for 1 minute with an alkali developing solution prepared by diluting NMD-3 developing solution (2.38% aqueous solution of tetramethylammonium hydroxide, made by Tokyo Ouka Kogyo) to 0.45%. After development, the resist film was washed with water and the thickness of the remaining resist film was measured. The remaining film thickness was plotted against the exposure (mJ/cm$^2$ at 365 nm), and the minimum exposure at which the ratio of the remaining film is 0 was obtained. (The minimum exposure is defined as sensitivity.) It was about 30 mJ/cm$^2$. This indicates that the positive photoresist has a high sensitivity.

EXAMPLE 2

A two-layer resist was formed. The lower layer was formed by applying OFPR-800 (made by Tokyo Ouka Kogyo) to a silicon wafer by spin coating to give a 2.0 μm thick coating. The coating was baked at 90° C. for 30 minutes and then at 200° C. for 30 minutes. The top layer (1.0 μm thick) was formed using the same resist solution and method as in Example 1.

Using the coated silicon wafer, the sensitivity of the resist film was measured in the same manner as in Example 1. It was about 30 mJ/cm$^2$. The coated silicon wafer was also examined for patterning performance. First, the resist film was exposed through a glass mask placed in close contact with the resist film. The top layer was developed in the same manner as in Example 1. A resolution of 0.8 μm was achieved. Using the top layer resist as a mask, the etching of the lower layer was performed with oxygen plasma in a parallel flat plate type $O_2$RIE apparatus ($O_2$ pressure: 3 mtorr, RF 0.64 mW/cm$^2$ (7 MHz), cathode bias voltage −130 V). The pattern of the top layer resist was accurately transferred to the lower layer resist. This result indicates that the resist of the invention can be used as the top layer resist in the two-layer resist method.

EXAMPLE 3

A two-layer resist was formed. The lower layer was formed by applying PIQ (made by Hitachi Kasei) to a silicon wafer by spin coating to give a 2.0 μm thick coating. The coating was baked at 250° C. for 30 minutes and then at 350° C. for 30 minutes. The top layer (1.0 μm thick) was formed using the same resist solution and method as in Example 1.

The sensitivity obtained in the same manner as in Example 1 was about 30 mJ/cm$^2$. The patterning of the top layer resist was carried out and the etching of the lower layer resist with oxygen plasma were performed in the same manner as in Example 1. A resolution of 0.8 μm was achieved. This result indicates that the resist of the invention can be used for the fabrication of an organic insulation film.

EXAMPLES 4 TO 53

Experiments were carried out under varied conditions according to the methods employed in Examples 1 to 3. Tables 1 to 3 show the constituents of the composition, the formulation of the composition, the film thickness, the organic matter on the substrate, the conditions of developing and rinsing, and the sensitivity and resolution in the respective experiments with polymers XXV, XXVI, and XXVII.

The results in the examples demonstrate that the compositions of the invention are superior in sensitivity, resolution, and resistance to oxygen plasma, and they are a useful material for microfabrication.

TABLE 1

| Experiments with Polymer XXV | | | | | | | | |
|---|---|---|---|---|---|---|---|---|
| Example No. | 4 | 5 | 6 | 7 | 8 | 9 | 10 | 11 | 12 |

TABLE 1-continued

Experiments with Polymer XXV

| Top layer resist | | | | | | | | | |
|---|---|---|---|---|---|---|---|---|---|
| Polymer XXV (wt %) | OH 86% (70) | OH 86% (48) | OH 86% (95) | OH 86% (90) | OH 86% (90) | OH 86% (90) | OH 86% (90) | OH 86% (90) | OH 86% (90) |
| Other polymer (wt %) | — | (32)* | — | — | — | — | — | — | — |
| Photosensitive dissolution inhibitor (wt %) | II (30) | II (20) | IV (5) | XII (10) | XII (10) | XII (10) | XII (10) | XII (10) | XII (10) |
| Film thickness (μm) | 0.2 | 0.2 | 0.2 | 0.2 | 0.8 | 0.2 | 0.2 | 0.8 | 0.8 |
| Organic matter on the substrate | — | — | — | — | — | PIQ | PIQ | PIQ | PIQ |
| Conditions of developing and rinsing | 3.3% aq. Me4NOH 20 s pure water 60 s | 3.2% aq. Me4NOH 30 s pure water 60 s | 3.0% aq. Me4NOH 30 s pure water 60 s | 2.7% aq. Me4NOH 100 ml + ethyl cellosolve 24 ml 30 s, pure water 60 s | 2.7% aq. Me4NOH 100 ml + ethyl cellosolve 24 ml 2 min, pure water 60 s | 3.3% aq. Me4NOH 20 s pure water 60 s | 2.7% aq. Me4NOH 100 ml + ethyl cellosolve 24 ml 30 s, pure water 60 s | 3.3% aq. Me4NOH 2 min pure water 60 s | 2.7% aq. Me4NOH 100 ml + ethyl cellosolve 24 ml 2 min, pure water 60 s |
| Sensitivity (mJ/cm² at 365 nm) | 80 | 80 | 100 | 50 | 75 | 130 | 80 | 110 | 110 |
| Resolution (μm) | 0.5 | 0.5 | 0.5 | 0.5 | 0.8 | 0.5 | 0.5 | 0.8 | 0.8 |

| Example No. | 13 | 14 | 15 | 16 | 17 | 18 | 19 | 20 |
|---|---|---|---|---|---|---|---|---|
| Top layer resist | | | | | | | | |
| Polymer XXV (wt %) | OH 100% (80) | OH 100% (80) | OH 100% (80) | OH 100% (80) | OH 70% (80) | OH 70% (80) | OH 70% (80) | OH 70% (80) |
| Other polymer (wt %) | — | — | — | — | — | — | — | — |
| Photosensitive dissolution inhibitor (wt %) | XII (20) | XII (20) | XII (20) | XII (20) | XII (20) | XII (20) | XII (20) | XII (20) |
| Film thickness (μm) | 0.2 | 0.8 | 0.8 | 0.8 | 0.2 | 0.8 | 0.2 | 0.8 |
| Organic matter on the substrate | — | — | PIQ | PIQ | — | — | PIQ | PIQ |
| Conditions of developing and rinsing | 2.7% aq. Me4NOH 100 ml + ethyl cellosolve 24 ml 30 s, pure water 60 s | 2.7% aq. Me4NOH 100 ml + ethyl cellosolve 24 ml 2 min, pure water 60 s | 3.3% aq. Me4NOH 30 s pure water 60 s | 3.3% aq. Me4NOH 2 min pure water 60 s | 2.7% aq. Me4NOH 100 ml + ethyl cellosolve 24 ml 30 s, pure water 60 s | 2.7% aq. Me4NOH 100 ml + ethyl cellosolve 24 ml 2 min, pure water 60 s | 3.3% aq. Me4NOH 30 s pure water 60 s | 3.3% aq. Me4NOH 2 min pure water 2 min |
| Sensitivity (mJ/cm² at 365 nm) | 50 | 80 | 90 | 110 | 70 | 100 | 120 | 140 |
| Resolution (μm) | 0.5 | 0.8 | 0.5 | 0.8 | 0.5 | 0.8 | 0.5 | 0.8 |

*Cresol novolak

TABLE 2

Experiments with Polymer XXVI

| Example No. | 21 | 22 | 23 | 24 | 25 |
|---|---|---|---|---|---|
| Top layer resist | | | | | |
| Polymer XXVI (wt %) | OH 90% (75) | OH 90% (91) | OH 90% (87) | OH 90% (91) | OH 90% (83) |
| Other polymer (wt %) | — | — | — | — | — |
| Photosensitive dissolution inhibitor (wt %) | XII (25) | X (9) | VI (13) | VII (9) | IX (17) |
| Film thickness (μm) | 0.20 | 0.25 | 0.20 | 0.22 | 0.20 |
| Organic matter on the substrate | OFPR-800 | OFPR-800 | OFPR-800 | OFPR-800 | OFPR-800 |
| Conditions of developing and rinsing | 0.5% or 0.6% aq. Me4NOH 60 s pure water 60 s | 0.5% or 0.6% aq. Me4NOH 60 s pure water 60 s | 0.5% or 0.6% aq. Me4NOH 60 s pure water 60 s | 0.5% or 0.6% aq. Me4NOH 60 s pure water 60 s | 0.5% or 0.6% aq. NH4NOH pure water 60 s |
| Sensitivity (mJ/cm² at 365 nm) | 120 | 150 | 180 | 180 | 200 |
| Resolution (μm) | 0.5 | 0.5 | 0.5 | 0.5 | 0.5 |

| Example No. | 26 | 27 | 28 | 29 | 30 |
|---|---|---|---|---|---|
| Top layer resist | | | | | |
| Polymer XXVI (wt %) | OH 90% (87) | OH 90% (91) | OH 90% (83) | OH 71% (87) | OH 71% (86) |
| Other polymer (wt %) | — | — | — | — | — |
| Photosensitive dissolution inhibitor (wt %) | V (13) | XI (9) | VIII (17) | XII (13) | X (14) |
| Film thickness (μm) | 0.20 | 0.26 | 0.20 | 0.45 | 0.40 |
| Organic matter on the substrate | OFPR-800 | OFPR-800 | OFPR-800 | OFPR-800 | OFPR-800 |

TABLE 2-continued

Experiments with Polymer XXVI

| Conditions of developing and rinsing | 0.5% or 0.6% aq. Me₄NOH 60 s pure water 60 s | 0.5% or 0.6% aq. Me₄NOH 60 s pure water 60 s | 0.5% or 0.6% aq. Me₄NOH 60 s pure water 60 s | 0.7% aq. Me₄NOH 60 s pure water 60 s | 0.7% aq. Me₄NOH 60 s pure water 60 s |
|---|---|---|---|---|---|
| Sensitivity (mJ/cm² at 365 nm) | 150 | 150 | 150 | 180 | 200 |
| Resolution (μm) | 0.5 | 0.5 | 0.5 | 0.5 | 0.5 |

| Example No. | 31 | 32 | 33 | 34 | 35 |
|---|---|---|---|---|---|
| Top layer resist | | | | | |
| Polymer XXVI (wt %) | OH 71% (83) | OH 71% (83) | OH 71% (83) | OH 71% (87) | OH 71% (87) |
| Other polymer (wt %) | — | — | — | — | — |
| Photosensitive dissolution inhibitor (wt %) | VI (17) | VII (17) | IX (17) | V (13) | XI (13) |
| Film thickness (μm) | 0.35 | 0.25 | 0.35 | 0.30 | 0.30 |
| Organic matter on the substrate | OFPR-800 | OFPR-800 | OFPR-800 | OFPR-800 | OFPR-800 |
| Conditions of developing and rinsing | 0.7% aq. Me₄NOH 60 s pure water 60 s | 0.7% aq. Me₄NOH 60 s pure water 60 s | 0.7% aq. Me₄NOH 60 s pure water 60 s | 0.7% aq. Me₄NOH 60 s pure water 60 s | 0.7% aq. Me₄NOH 60 s pure water 60 s |
| Sensitivity (mJ/cm² at 365 nm) | 150 | 180 | 150 | 160 | 180 |
| Resolution (μm) | 0.5 | 0.5 | 0.5 | 0.5 | 0.5 |

TABLE 3

Experiments with Polymer XXVII

| Example No. | 36 | 37 | 38 | 39 | 40 | 41 | 42 | 43 | 44 |
|---|---|---|---|---|---|---|---|---|---|
| Top layer resist | | | | | | | | | |
| Polymer XXVII (wt %) | OH 70% (90) | OH 70% (80) | OH 85% (90) | OH 85% (80) | OH 100% (90) | OH 100% (80) | OH 100% (80) | OH 100% (80) | OH 100% (80) |
| Other polymer (wt %) | — | — | — | — | — | — | — | — | — |
| Photosensitive dissolution inhibitor (wt %) | XII (10) | XII (20) | XII (10) | XII (20) | XII (10) | XII (20) | II, XII (10) (10) | X, XI, XII (20) 88%* | X, XI, XII (20) 67%* |
| Film thickness (μm) | 1.0 | 1.0 | 1.0 | 1.0 | 1.0 | 1.0 | 1.0 | 1.0 | 1.0 |
| Organic matter on the substrate | — | — | — | — | — | — | — | — | — |
| Conditions of developing and rinsing | 0.63% aq. Me₄NOH 60 s pure water 60 s | 0.63% aq. Me₄NOH 60 s pure water 60 s | 0.55% aq. Me₄NOH 60 s pure water 60 s | 0.55% aq. Me₄NOH 60 s pure water 60 s | 0.45% aq. Me₄NOH 60 s pure water 60 s | 0.45% aq. Me₄NOH 60 s pure water 60 s | 0.45% aq. Me₄NOH 60 s pure water 60 s | 0.45% aq. Me₄NOH 60 s pure water 60 s | 0.45% aq. Me₄NOH 60 s pure water 60 s |
| Sensitivity (mJ/cm² at 365 nm) | 50 | 60 | 50 | 60 | 40 | 50 | 60 | 50 | 70 |
| Resolution (μm) | 0.8 | 0.8 | 0.8 | 0.8 | 0.8 | 0.8 | 0.8 | 0.8 | 0.8 |

| Example No. | 45 | 46 | 47 | 48 | 49 | 50 | 51 | 52 | 53 |
|---|---|---|---|---|---|---|---|---|---|
| Top layer resist | | | | | | | | | |
| Polymer XXVII (wt %) | OH 100% (80) | OH 100% (80) | OH 100% (80) | OH 100% (75) | OH 100% (85) | OH 100% (80) | OH 100% (80) | OH 100% (80) | OH 100% (80) |
| Other polymer (wt %) | — | — | — | — | — | — | — | — | — |
| Photosensitive dissolution inhibitor (wt %) | X, XI, XII (10) 88%* | X, XI, XII (20) 67%* | X, XI, XII (10) 50%* | X, XI, XII (25) 88%* | X, XI, XII (15) 88%* | X, XI, XII (20) 88%* | X, XI, XII (20) 67%* | X, XI, XII (20) 88%* | X, XI, XII (20) 67%* |
| Film thickness (μm) | 1.0 | 1.0 | 1.0 | 1.0 | 1.0 | 1.0 | 1.0 | 1.0 | 1.0 |
| Organic matter on the substrate | — | — | — | — | — | OFPR-800 | OFPR-800 | PIQ | PIQ |
| Conditions of developing and rinsing | 0.45% NMD-3 60 s pure water 60 s | 0.45% NMD-3 60 s pure water 60 s | 0.45% NMD-3 60 s pure water 60 s | 0.45% NMD-3 60 s pure water 60 s | 0.45% NMD-3 60 s pure water 60 s | 0.45% NMD-3 60 s pure water 60 s | 0.45% NMD-3 60 s pure water 60 s | 0.45% NMD-3 60 s pure water 60 s | 0.45% NMD-3 60 s pure water 60 s |
| Sensitivity (mJ/cm² at 365 nm) | 30 | 50 | 80 | 35 | 25 | 30 | 50 | 30 | 50 |

TABLE 3-continued

| Experiments with Polymer XXVII | | | | | | | | | |
|---|---|---|---|---|---|---|---|---|---|
| Resolution (μm) | 0.8 | 0.8 | 0.8 | 0.8 | 0.8 | 0.8 | 0.8 | 0.8 | 0.8 |

*Ratio of esterification

What is claimed is:

1. A photosensitive resin composition comprising, in an admixture:

an alkali-soluble organosilicon polymer in which more than 40% of the polymer unit is one selected from the following formulae (1), (2) and (3)

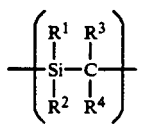
(1)

wherein $R^1$, $R^2$, $R^3$ and $R^4$ are hydrogen or monovalent organic groups, and at least one of the four side chains contain a phenolic hydroxy group wherein a benzene ring bonded to said phenolic hydroxy group is separated by one or more carbon atoms from the silicon atom

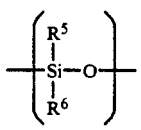
(2)

wherein $R^5$ and $R^6$ are monovalent organic groups, and at leas either of $R^5$ and $R^6$ contains alkyl group and a phenolic hydroxy group wherein a benzene ring bonded to said phenolic hydroxy group is bonded to a carbon atom of said alkyl group

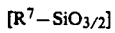
(3)

wherein $R^7$ contains an alkyl group and a phenolic hydroxy group wherein a benzene ring bonded to said phenolic hydroxy group is bonded to a carbon atom of said alkyl group; and a photosensitive dissolution inhibitor, wherein said organosilicon polymer and said photosensitive dissolution inhibitor are present in amounts sufficient to provide a positive type photoresist having a high sensitivity, high resolution and high resistance to oxygen plasma.

2. A photosensitive resin composition according to claim 1, wherein said organosilicon polymer is present in an amount from 70 to 95% by weight and said photosensitive dissolution inhibitor is present in an amount from 5 to 30% by weight.

3. A photosensitive resin composition according to claim 1, wherein said photosensitive dissolution inhibitor is an o-quinone diazide.

4. A photosensitive resin composition according to claim 3, wherein said o-quinone diazide is a 1,2-naphthoquinone diazide represented by the following formula (1)

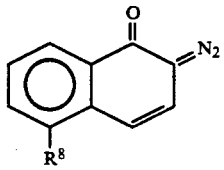
(4)

wherein $R^8$ is a monovalent organic group.

5. A photosensitive resin composition according to claim 1, further comprising a film former.

6. A photosensitive resin composition according to claim 5, wherein said film former is present in an amount from 0 to 40% by weight.

7. A photosensitive resin composition according to claim 5, wherein said film former is novolak resin.

8. A photosensitive resin composition according to claim 1, wherein $R^1$, $R^2$ and $R^5$ are methyl groups, $R^3$ is hydrogen, $R^4$ is a p-hydroxyphenyl group, and $R^6$ and $R^7$ are p-hydroxybenzyl groups.

9. A photosensitive resin composition according to claim 1, wherein more than 40% of the polymer unit of said alkali-soluble organosilicon polymer is represented by the formula (1) and said benzene ring bonded to said phenolic hydroxy group is separated by one carbon atom from the silicon atom.

10. A photosensitive resin composition according to claim 1, wherein more than 40% of the polymer unit of said alkali-soluble organosilicon polymer is represented by the formula (2) and said benzene ring bonded to said phenolic hydroxy group is bonded to a carbon atom of a $C_1$–$C_2$ alkyl group.

11. A photosensitive resin composition according to claim 1, wherein more than 40% of the polymer unit of said alkali-soluble organosilicon polymer is represented by the formula (3) and said benzene ring bonded to said phenolic hydroxy group is bonded to a carbon atom of a $C_1$–$C_2$ alkyl group.

12. A photosensitive resin solution comprising:

a photosensitive resin composition according to claim 1, and an organic solvent.

* * * * *